United States Patent
Lee et al.

(10) Patent No.: US 7,685,963 B2
(45) Date of Patent: Mar. 30, 2010

(54) METHOD OF AND APPARATUS FOR DISPENSING PHOTORESIST IN MANUFACTURING SEMICONDUCTOR DEVICES OR THE LIKE

(75) Inventors: Jong-Haw Lee, Yongin-si (KR); Jin-Jun Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1239 days.

(21) Appl. No.: 11/219,662

(22) Filed: Sep. 7, 2005

(65) Prior Publication Data

US 2006/0075965 A1  Apr. 13, 2006

(30) Foreign Application Priority Data

Oct. 13, 2004  (KR) ...................... 10-2004-0081565

(51) Int. Cl.
   *B05C 5/02* (2006.01)
(52) U.S. Cl. .......................... 118/319; 118/320; 118/52; 118/694
(58) Field of Classification Search .................. 118/52, 118/56, 319, 320, 694; 396/611
   See application file for complete search history.

(56) References Cited

U.S. PATENT DOCUMENTS

| | | | |
|---|---|---|---|
| 5,134,962 A * | 8/1992 | Amada et al. | ............... 118/688 |
| 5,858,466 A | 1/1999 | Liu et al. | |
| 6,171,367 B1 | 1/2001 | Peng et al. | |
| 6,616,760 B2 * | 9/2003 | Kitano et al. | ............... 118/302 |
| 6,848,625 B2 * | 2/2005 | Takekuma et al. | ............. 239/1 |

\* cited by examiner

*Primary Examiner*—Laura Edwards
(74) *Attorney, Agent, or Firm*—Volentine & Whitt, PLLC

(57) ABSTRACT

In a photoresist dispensing apparatus for use in manufacturing a semiconductor device, to coercively emit photoresist from a bottle by using a dispensing pump and to pass it through a supply line and a filter to obtain a filtering operation, and to spray the filtered photoresist to a wafer through a spraying nozzle; a bubble removal unit is equipped with the supply line, before the dispensing pump. Large and micro bubbles generated in the midst of flow of photoresist, and foreign substances, are substantially filtered off so as to supply photoresist of a good quality. A floating load in a foreign substance removal filter is substantially removed, thus spraying photoresist under an always uniform and stabilized pressure by using a dispensing pump, to cover a wafer with photoresist in a uniform thickness and obtain a precise pattern formation.

23 Claims, 4 Drawing Sheets

METHOD OF AND APPARATUS FOR DISPENSING PHOTORESIST IN MANUFACTURING SEMICONDUCTOR DEVICES OR THE LIKE

BACKGROUND OF THE INVENTION

1. Field of the Invention

The present invention relates to the manufacturing of semiconductor devices or the like. More particularly, the present invention relates to the dispensing of photoresist onto a wafer or other substrate.

2. Description of the Related Art

In general, the manufacturing of semiconductor devices involves subjecting a wafer to a series of processes such as diffusion, photolithography, etching, ion implantation and deposition processes. In particular, the photolithography and etching processes are carried out to form a pattern, e.g., a circuit pattern, on the wafer. The photolithography process entails forming a mask on a wafer to expose portions of a layer underlying the mask. The etching process entails removing the portions of the layer exposed by the mask.

The photolithography process begins by dispensing a chemical, namely a photoresist, onto a surface on a wafer, and forming a uniform thin layer of the photoresist over the entire surface. The layer of photoresist is then exposed by light directed through a reticle. The reticle has a pattern corresponding to the pattern to be formed on the wafer. Accordingly, an image of the pattern of the reticle is transferred to the layer of photoresist. Then, the layer of photoresist is developed. The developing process removes either the exposed or non-exposed portions of the photoresist to thereby form a photoresist pattern, i.e., a mask, on the wafer.

FIG. 1 illustrates a conventional photoresist dispensing apparatus of semiconductor device manufacturing equipment.

As shown in FIG. 1, the dispensing apparatus includes bottles 10 containing photoresist, a supply line 20 connected to the bottles 10, a pump 30 and a filter 40 disposed in the supply line 20, and a spray nozzle 50 connected to an end of the supply line 20. The photoresist is withdrawn from the bottles 10 and is forced through the supply line 20 by the pump 30. Then, the photoresist is sprayed onto a wafer W by the spray nozzle 50. The most important aspect of spraying the photoresist onto the wafer W is that the photoresist cover the wafer W uniformly.

However, even if the layer of photoresist covering the wafer W has a uniform thickness, the photomask formed from the layer of photoresist will be defective if the photoresist itself contains foreign substances. A defective photomask will, in turn, cause defects in the pattern formed on the wafer by the subsequent etching process. In view of this, the filter 40 is disposed in the supply line 20 to remove foreign substances from the photoresist before the photoresist is dispensed onto the wafer W.

Furthermore, bubbles generated in the photoresist flowing through the supply line 20 affect the quantity of photoresist sprayed by the nozzle 50. Accordingly, bubbles in the photoresist can cause defects in the mask and hence, in the pattern formed by the etching process. In fact, even micro-bubbles entrained in the photoresist can severely influence the quality of a pattern formed according to the design rule of today's highly integrated semiconductor devices. Therefore, the filter 40 is also designed to remove bubbles from the photoresist in the supply line 20.

However, the bubbles removed form the photoresist by the filter 40 form a film that floats on the liquid in the filter 40. The film acts as a load on the photoresist flowing through the filter 40. Thus, the rate at which the photoresist passes through the filter 40 rapidly decreases as bubbles and foreign substances are simultaneously filtered. That is, the bubbles offer resistance to the photoresist passing through the filter 40, thereby reducing the volume of photoresist sprayed through the nozzle 50.

Also, the pressure generated at the inlet of the dispensing pump 30, which acts to withdraw photoresist from a bottle 10, becomes weaker than the pressure generated by the dispensing pump 30 at its outlet to force photoresist through the nozzle 50. The effect of this pressure difference manifests itself along the entire length of the supply line 20 from the bottles 10 to the dispensing pump 30. Consequently, even more bubbles are created in the photoresist flowing through the supply line 20. In fact, the problem can exacerbate until an entire portion of the supply line 20 is occupied by bubbles, i.e., a gap that is devoid of photoresist may be produced in the supply line 20. Thus, the rate at which the photoresist sprayed through the spraying nozzle 50 fluctuates and, as a result, the thickness of the layer of photoresist covering the wafer is not uniform. As mentioned above, the end results are a defective mask, and defects in the pattern formed on the wafer by an etching process that uses the mask.

SUMMARY OF THE INVENTION

Accordingly, a general object of the present invention is to provide a method of and apparatus for dispensing photoresist at a constant rate such that a substrate can be covered with a uniformly thick layer of the photoresist.

Another object of the present invention is to provide a method of and apparatus for delivering photoresist to a spray nozzle in a manner that prevents or minimizes the production of bubbles in the photoresist.

Yet another object of the present invention is to provide a method of and apparatus for dispensing photoresist using a pump wherein the volume of photoresist provided for the pump is maintained within a given range.

The dispensing apparatus of the present invention includes at least one bottle containing photoresist, a spray nozzle, a supply line connecting the spray nozzle to the at least one bottle, a first (foreign substance removal) filter disposed in the supply line at an end of the supply line proximate the spray nozzle, and a dispensing pump for delivering photoresist through the first filter and spray nozzle. The dispensing pump is connected to the supply line proximate an end of the supply line to which the spray nozzle is connected.

According to one aspect of the present invention, a bubble removal filter is disposed in the supply line downstream of the charge pump and upstream of the first filter to remove air bubbles from the photoresist. Preferably, the bubble removal filter has a housing, an inlet pipe and an outlet pipe that extend from the housing, and a membrane disposed in the housing. The inlet and outlet pipes may extend from opposite sides of the housing so as to be disposed in series. In this case, the housing has an inner diameter larger than each of the inner diameters of the inlet and outlet pipes. An exhaust pipe may be connected to the housing of the bubble removal filter so that air formed from an accumulation of the bubbles in the housing can be exhausted from the housing.

According to another aspect of the present invention, a charge pump is connected to the supply line upstream of the dispensing pump to coerce photoresist into the supply line from the at least one bottle, and a buffer is tank disposed in the supply line between the charge pump and the dispensing pump so as to store a volume of the photoresist for delivery to the spray nozzle by the dispensing pump.

In this case, and according to another aspect of the invention, the charge pump has a higher capacity, in terms of pressure generated, than the dispensing pump. Thus, the charge pump can deliver photoresist that is substantially free of bubbles to the buffer tank.

Still further, and according to another aspect of the present invention, a bubble removal filter is disposed in the supply line downstream of the charge pump and upstream of the foreign substance removal filter, and the buffer tank is disposed between the bubble removal filter and the dispensing pump. The membrane of the bubble removal filter is stronger, under a given fluid pressure, than the membrane of the foreign substance removal filter.

According to yet another aspect of the present invention, a method of dispensing photoresist onto a wafer comprises operating a dispensing pump to pump photoresist at first rate through a spray nozzle, maintaining a volume of the photoresist in a buffer tank connected to an inlet of the dispensing pump so that a constant supply of the photoresist is provided for the dispensing pump as the dispensing pump is operated, and operating a charging pump to pump photoresist into the buffer tank at a second rate that is greater than the first rate.

BRIEF DESCRIPTION OF THE DRAWINGS

These and other objects, features and advantages of the present invention will become more fully understood from the detailed description thereof made below with reference to the accompanying drawings, of which.

DETAILED DESCRIPTION OF THE PREFERRED EMBODIMENTS

Figure 1:
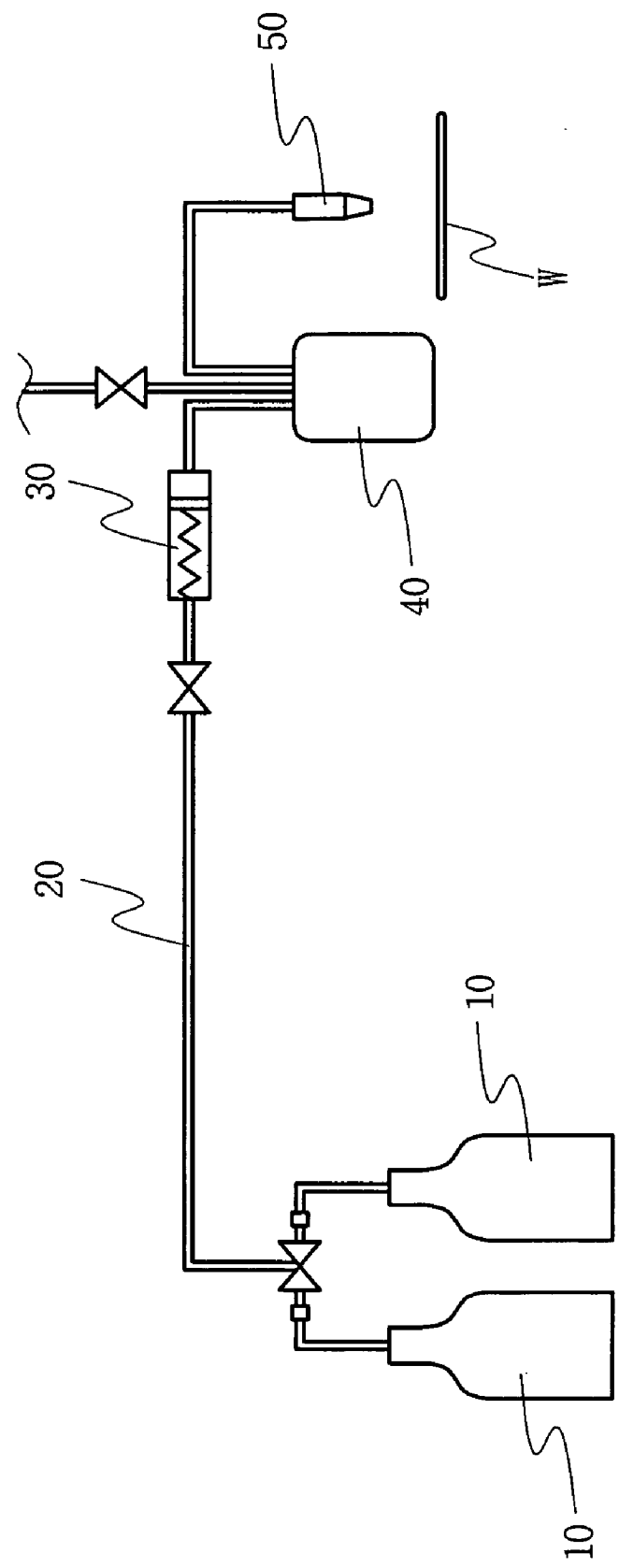
FIG. 1 is a schematic diagram of a prior art photoresist dispensing apparatus for use in manufacturing a semiconductor device.

Hereinafter, the preferred embodiments of the present invention will be described in detail with reference to FIGS. 2 to 4. Like elements are designated by like reference numerals throughout the drawings.

Photoresist dispensing apparatus according to the present invention have a configuration similar to that of a conventional dispensing apparatus. More specifically, the dispensing apparatus include a bottle 10 for storing a predetermined volume of photoresist, a supply line 20 through which the photoresist flows from the bottle 10, a dispensing pump 30 that pumps photoresist through the supply line 20, a foreign-substance removal filter 40 for filtering foreign-substances from the photoresist, and a spray nozzle 50 for spraying the photoresist onto a wafer W. The foreign-substance removal filter 40 may comprise a porous membrane of polytetrafluoroethylene by which a sieving of the photoresist takes place.

Figure 2:
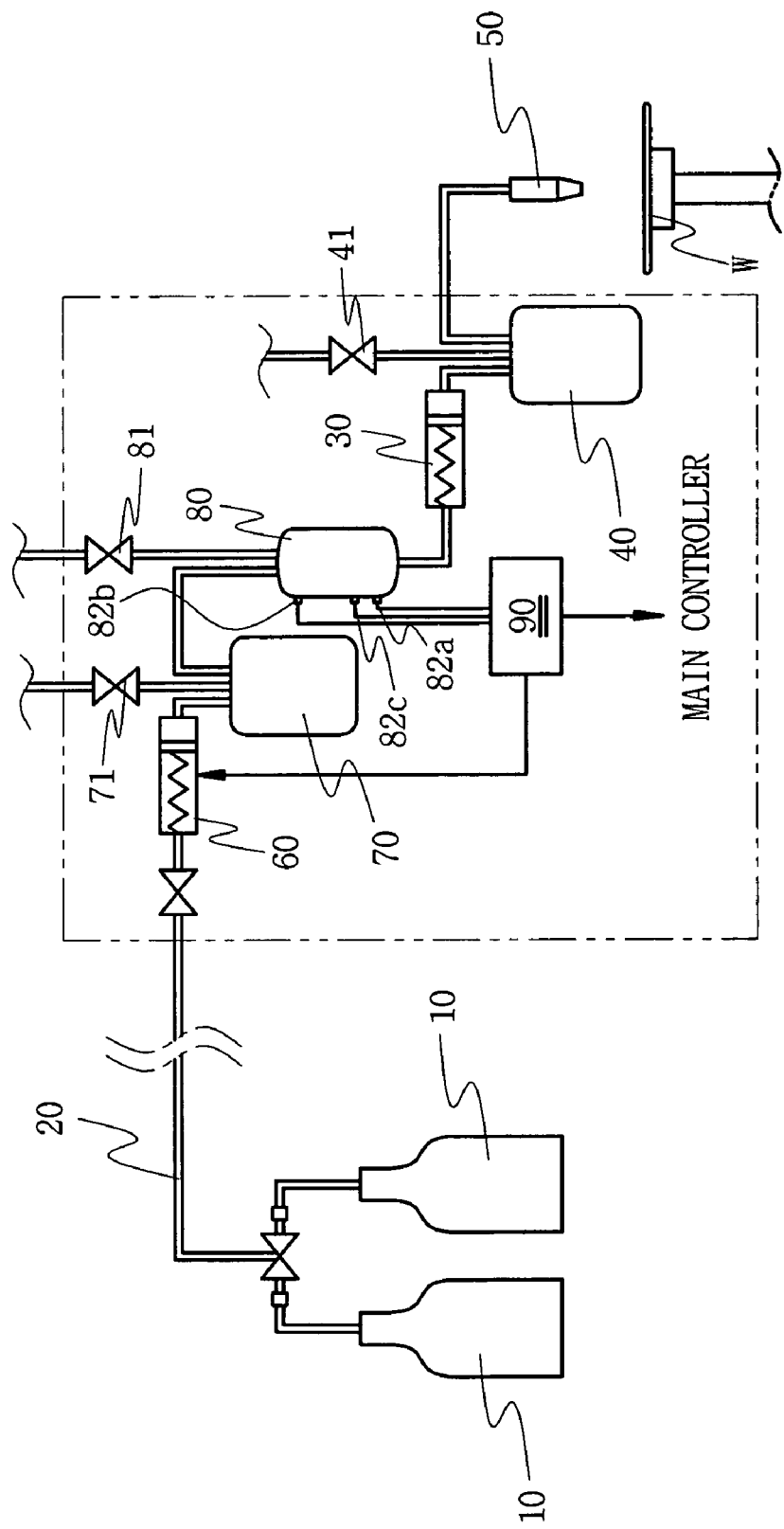
FIG. 2 is a schematic diagram of a first embodiment of a photoresist dispensing apparatus according to the present invention.

In the embodiment shown in FIG. 2, the photoresist dispensing apparatus also includes a bubble removal unit that is disposed in the supply line 20 upstream of the dispensing pump 30. The bubble removal unit includes a charge pump 60, a bubble removal filter 70 and a buffer tank 80.

The charge pump 60 coerces photoresist from the bottle 10. Preferably, the charge pump 60 has a larger capacity than the dispensing pump 30. In other words, the charge pump 60 delivers photoresist from the bottle 10 to the dispensing pump 30 at a relatively high rate, whereas the dispensing pump 30 pumps the photoresist at a relatively low rate sufficient to generate the pressure required to force the photoresist through the spray nozzle 50. Accordingly, the pumping action of the dispensing pump 30 does not generate bubbles in the supply line 20.

The photoresist coerced from the bottle 10 by the high pressure generated by the charge pump 60 is passed through the bubble removal filter 70. As shown in FIG. 3, the bubble removal filter 70 has a housing, an inlet pipe 72a and an outlet pipe 72b extending from the housing at opposite sides thereof and communicating with the interior of the housing, and a membrane 72c disposed in the housing as interposed between the inlet pipe 72a and the outlet pipe 72b. The interior of the housing occupied by the membrane 72c has a diameter larger than those of the inlet pipe 72a and the outlet pipe 72b. Also, the membrane 72c of the bubble removal filter 70 is preferably stiffer and stronger than the membrane of the foreign substance removal filter 40 seeing that the pressure generated by the charge pump 60 is greater than the pressure generated by the dispensing pump 30.

The membrane 72c serves to trap bubbles removed from photoresist passing through the housing from the inlet pipe 72a to the outlet pipe 72b. For example, the membrane 72c may be of UPE (ultra-high molecular weight polyethylene). The photoresist induced through the inlet pipe 72a is under a relatively high pressure because of the relatively small inner diameter of the inlet pipe 72a. The pressure of the photoresist then decreases rapidly as the photoresist passes through the membrane 72c because the housing in which the membrane 72c is disposed has an inner diameter larger than that of the inlet pipe 72a. Both large and micro-bubbles are released from the photoresist and cling to membrane 72c due to the decrease in pressure in the photoresist.

Then, the photoresist from which the large and micro bubbles have been removed is discharged through the outlet pipe 72b. The bubble removal filter 70 may also have an exhaust pipe 72d connected to the housing. Air from the bubbles removed from the photoresist is discharged from the housing through the exhaust pipe 72d. On the other hand, a drain pipe may also be connected to the housing of the bubble removal filter 70. A valve 71 is disposed in the drain pipe. Accordingly, photoresist can be drained from the bubble removal filter 70 when the valve 71 is opened.

Referring again to FIG. 2, the buffer tank 80 stores a given volume of the photoresist that has passed through the bubble removal filter 70. Accordingly, the buffer tank 80 provides a stable supply of photoresist for the dispensing pump 30. Also, a plurality of level sensors 82a, 82b and 82c are installed in the buffer tank 80 to sense for the presence of photoresist at the top, bottom and center of the buffer tank 80, respectively. Still further, a drain line is connected to the buffer tank 80. A valve 81 is disposed in the drain line so that the buffer tank 80 can be drained when the valve 81 is opened.

The respective level sensors 82a, 82b and 82c are connected to an auxiliary controller 90. The auxiliary controller 90 is connected to the charge pump 60 so as to control the operation of the pump 60 based on signals received from the level sensors 82a, 82b and 82c. The auxiliary controller 90 is also connected to a main controller. The overall operation of the dispensing apparatus is controlled by the main controller. With this configuration, the portion of the dispensing apparatus from the charge pump 60 to the foreign substance removal filter 40 proximate the spray nozzle 50 can be provided as a discrete charge/dispensing unit (as illustrate by the dashed line in FIG. 2).

The operation of the photoresist dispensing apparatus will now be described in more detail.

When the apparatus begins operating, the charge pump 60 draws photoresist from the bottle 10 into supply line 20, and pumps the photoresist through the bubble removal filter 70 and into the buffer tank 80. Accordingly, the photoresist filling the buffer tank 80 is free of large and micro bubbles. The level sensor 82b senses when the buffer tank 80 is filled with photoresist by the charge pump 60, i.e., senses when the level of photoresist arrives at the top of the buffer tank 80. At this time, the auxiliary controller 90 shuts down the operation of the charge pump 60.

The photoresist is then continuously discharged through the spray nozzle 50. That is, the photoresist is withdrawn from the buffer tank 80 by the dispensing pump 30, and then is passed through the foreign substance removal filter 40 so that foreign substances are removed from the photoresist. The dispensing pump 30 also forces the photoresist through the spray nozzle 50 and thus, onto the wafer W.

Accordingly, the volume of photoresist in the buffer tank 80 is rapidly reduced until the level of photoresist arrives at a central portion of the tank 80. The level sensor 82c senses when the level of photoresist falls below the central portion of the tank 80, whereupon the auxiliary controller 90 re-starts the charge pump 60 to fill the buffer tank 80 again with photoresist. The operation of the charge pump 60 is thus controlled so that a certain volume of photoresist is always maintained in the buffer tank 80. Therefore, the dispensing pump 30 always discharges the photoresist through the spraying nozzle 50 in a uniform and stable manner. That is, the rate at which the photoresist is dispensed onto the wafer always remains constant.

If the level of photoresist in the buffer tank 80 ever reaches the bottom of the buffer tank 80, the auxiliary controller 90 transfers a drive stop signal to the main controller. The main controller stops the operation of the dispensing apparatus, i.e, stops the operation of the dispensing pump 30, upon receipt of the drive stop signal from the auxiliary controller 90. At the same time, the main controller opens a drain valve 81 disposed in a drain line connected to the buffer tank 80 to empty the buffer tank 80 of the photoresist remaining in the bottom of the buffer tank 80.

Moreover, the entire operation of the dispensing apparatus can be stopped when a different type of photoresist is to be dispensed by the apparatus or when a bottle 10 of the photoresist is to be exchanged. In this state, the main controller opens drain valves 41, 71 and 81 and operates a dedicated high capacity suction pump to remove photoresist from within the supply line 20 and from within the components of the charge/dispensing unit of the apparatus to which the drain lines containing the valves 41, 71 and 81 are connected.

Next, a second embodiment of a photoresist dispensing apparatus according to the present invention will be described with reference to FIG. 4.

The second embodiment has a configuration similar to that of the first embodiment. Specifically, the second embodiment of the photoresist dispensing apparatus includes at least one bottle 10 for storing a given volume of photoresist, a supply line 20 connected to the at least one bottle 10, a dispensing pump 30 for drawing photoresist into the supply line 20 from the bottle 10 a foreign substance removal filter 40 downstream of the dispensing pump 30, a spray nozzle 50 by which the photoresist is sprayed uniformly onto a wafer W, and a bubble removal unit disposed within the supply line 20.

However, unlike the first embodiment, the bubble removal unit of the second embodiment includes a first charge pump 60, a first buffer tank 100, a bubble removal filter 70, a second charge pump 110 and a second buffer tank 80.

The first charge pump 60 coerces photoresist from the bottle 10. The dispensing pump 30 forces photoresist through the spray nozzle 50 and onto to a wafer W. Preferably, the first charge pump 60 has a larger capacity, i.e., generates a greater amount of pressure, than the dispensing pump 30.

The first buffer tank 100 is filled by the first charge pump 60. Also, a volume of photoresist within a predetermined range is maintained within the first buffer tank 100. To this end, a plurality of level sensors are provided to detect the amount of photoresist in the first buffer tank 100. In particular, a bottom level sensor 102a, a top level sensor 102b and a center level sensor 102c are disposed on the buffer tank at positions corresponding to top, bottom and central portions of the tank 100, respectively.

Figure 3:
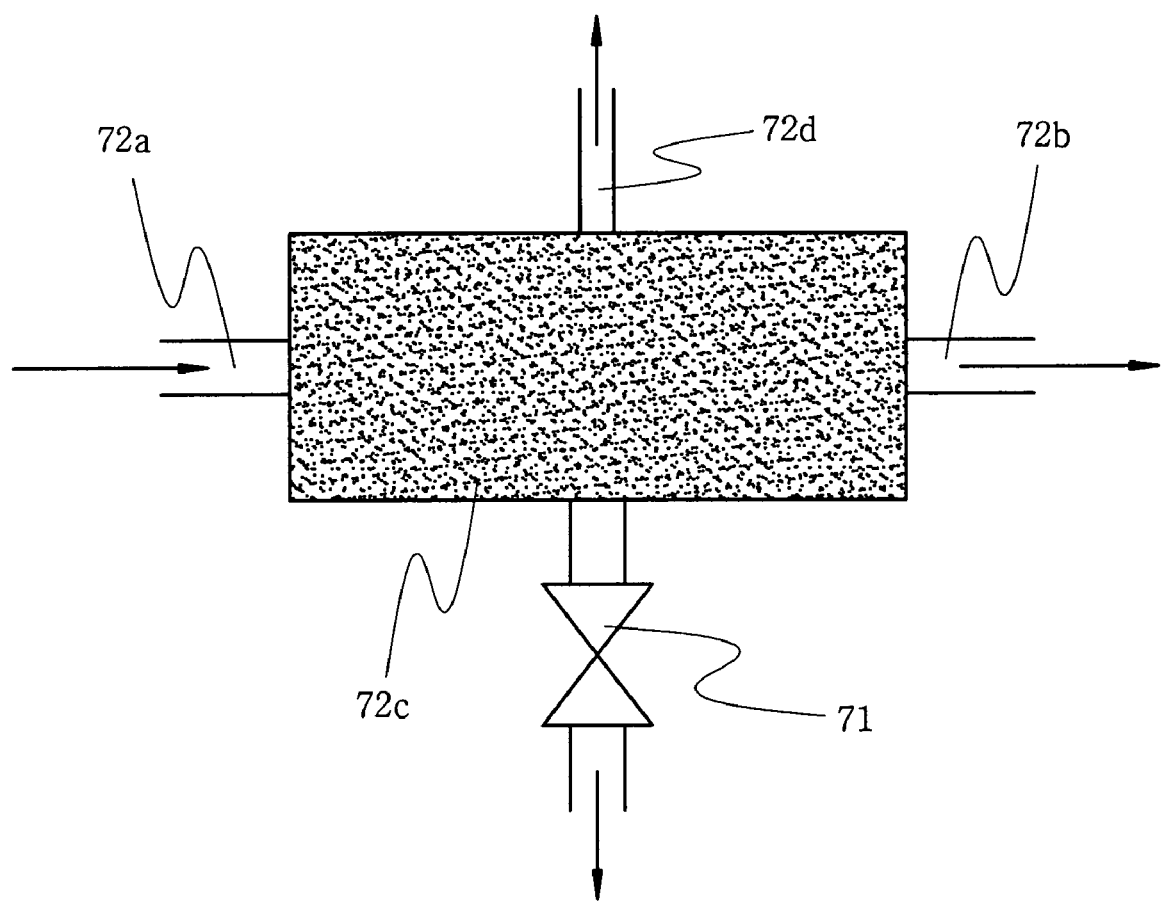
FIG. 3 is a schematic diagram of a bubble removal filter of the photoresist dispensing apparatus according to the present invention.
Figure 4:
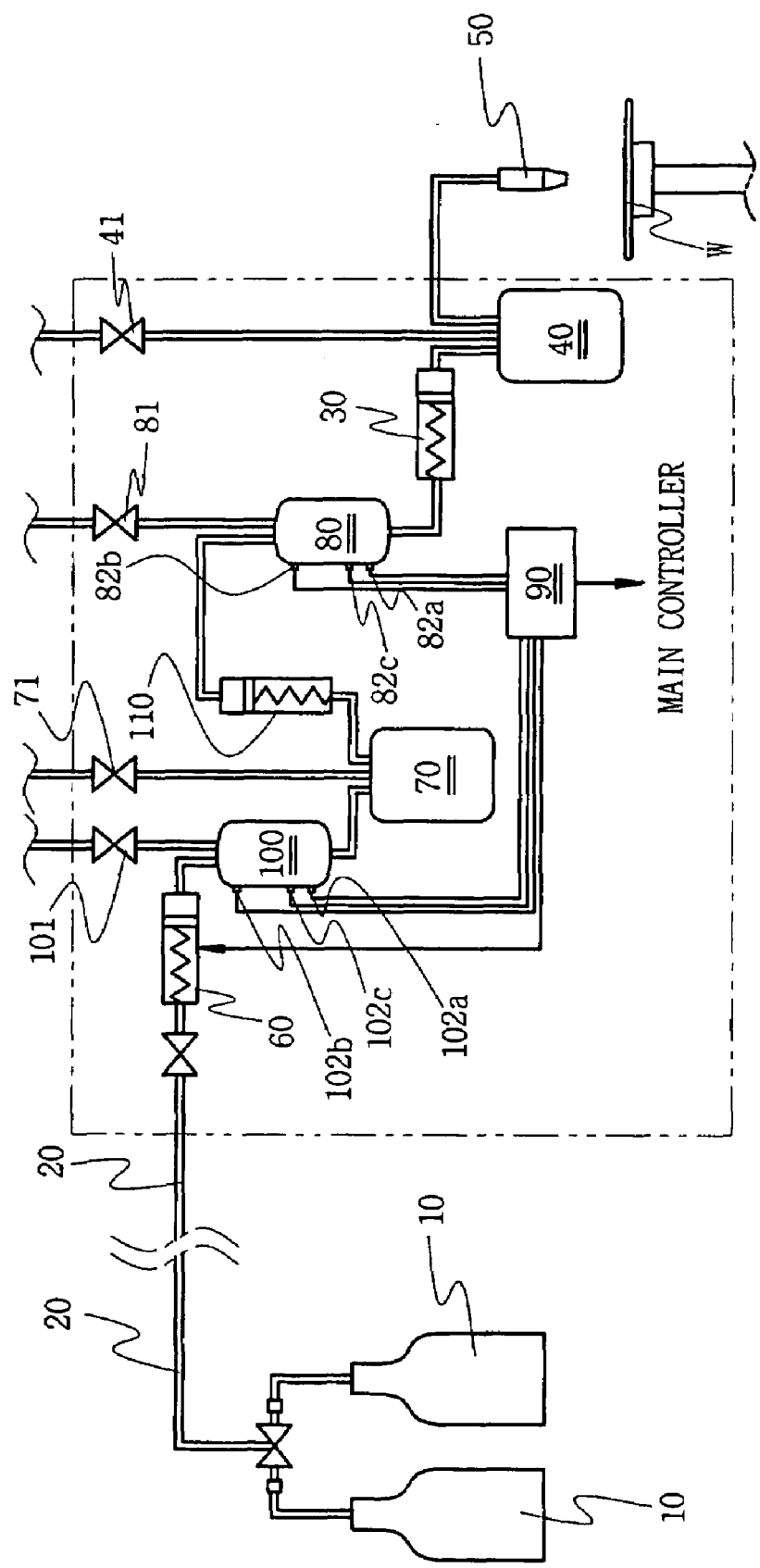
FIG. 4 is a schematic diagram of a second embodiment of a photoresist dispensing apparatus according to the invention.

The bubble removal filter 70 is of the type shown in FIG. 3. That is, the bubble removal filter 70 has a housing, an inlet pipe 72a and an outlet pipe 72b extending from the housing at opposite sides thereof and communicating with the interior of the housing, and a membrane 72c disposed in the housing as interposed between the inlet pipe 72a and the outlet pipe 72b. The interior of the housing occupied by the membrane 72c has a diameter larger than those of the inlet pipe 72a and the outlet pipe 72b. Also, the membrane 72c of the bubble removal filter 70 is preferably stiffer and stronger than the membrane of the foreign substance removal filter 40 to withstand the pressure generated by the charge pump 60 which pressure is greater than the pressure generated by the dispensing pump 30. Accordingly, the bubble removal filter 70 removes any bubbles from the photoresist stored in the first buffer tank 100.

The second charge pump 110 is disposed downstream of the first buffer tank 100 to withdraw photoresist rapidly from the tank 100. Thus, bubbles are not re-generated in the photoresist that has been passed through the bubble removal filter 70.

The second buffer tank 80 stores a volume of photoresist delivered thereto by the second charge pump 110. The level of photoresist in the second buffer tank 80 is detected by a plurality of level sensors, namely a bottom sensor 82a, a top level sensor 82b and a center level sensor 82c. The respective level sensors 82a, 82b and 82c are connected to the auxiliary controller 90 so as to issue signals, indicative of the amount of photoresist in the second buffer tank 80, to the auxiliary controller 90. The auxiliary controller 90 is also connected to a main controller. The operation of the first charge pump 60 and the second charge pump 110 are controlled by the auxiliary controller 90 based on the signals issued by the respective level sensors 82a, 82b and 82c, 102a, 102b and 102c. The general operation of the dispensing apparatus is controlled by the main controller based, in part, on a signal issued to the main controller by the auxiliary controller 90. With this configuration, the portion of the dispensing apparatus comprising the first charge pump 60, the first buffer tank 100, the bubble removal filter 70, the second charge pump 110 and the filter 40 proximate the spray nozzle 50 can be provided as a discrete unit for assembly into the dispensing apparatus.

Next, the operation of the second embodiment of the dispensing apparatus according to the present invention will be described in more detail.

Photoresist is coerced from the bottle 10 by the first charge pump 60, and a certain volume of the photoresist is stored in the first buffer tank 100. From there, the photoresist is forced through the bubble removal filter 70 to remove bubbles from the photoresist.

The photoresist is then pumped into the second buffer tank 80 by the second charge pump 110. Next, the photoresist is withdrawn from the second buffer tank 80, and is passed through the filter 40 by the dispensing pump 30 so that foreign substances are removed from the photoresist. Subsequently, the photoresist is sprayed onto a wafer W through the spray nozzle 50.

During this process, photoresist filling the first buffer tank 100 and the second buffer tank 80 is gradually consumed. Eventually, the level of the photoresist in the buffer tanks 100, 80 reaches central portions of the tanks 100, 80. The center level sensors 101c, 82c sense a drop in the level of the photoresist from the central portions of the tanks 100, 80, and issue signals to the controller 90. As a result, the controller 90 operates the first charge pump 60 and the second charge pump 110 to fill the first and second buffer tanks 100 and 80.

Thus, a steady volume of photoresist is always maintained in the first and second buffer tanks 100 and 80. Therefore, photoresist is always discharged through the spray nozzle 50 at a constant rate by the dispensing pump 30.

If the level of photoresist in the respective first and second buffer tanks 100 and 80 ever reaches the bottom of the tanks, signals are issued by the bottom level sensors 101a and 82a to the auxiliary controller 90. The controller 90 responds to these signals by issuing a drive stop signal to the main controller. As a result, the main controller shuts down the operation of the dispensing apparatus to prevent defects that would otherwise result from a lack of photoresist in the system.

Once the operation of the dispensing apparatus is stopped, respective drain valves 101 and 81 are opened and photoresist is drained from the first buffer tank 100 and the second buffer tank 80 through the drain lines connected to the tanks. The draining of the photoresist is facilitated by a dedicated pump connected to the drain lines. The valves 101 and 81 are closed once the buffer tanks 100 and 80 have been drained.

Then the first charge pump 60 and the second charge pump 110 are operated to fill the first buffer tank 100 and the second buffer tank 80, respectively. The top level sensors 101b, 82b sense when the level of photoresist in the buffer tanks 100, 80 reaches the top of the tanks. At this time, the top level sensors 101b, 82b issue signals indicative of the tanks 100, 80 being filled to the auxiliary controller 90. In response, the controller 90 shuts down the first charge pump 60 and the second charge pump 100.

Meanwhile, the operation of the apparatus can be shut down as in the first embodiment when the apparatus is to dispense another type of photoresist and/or the bottle(s) is/are to be exchanged. In this case, photoresist in the supply line 20 and in the filters 70, 40 and the buffer tanks 100, 80 can be drained through respective drain lines by opening the valves 41, 71, 81, and 101. Again, a dedicated high capacity suction pump is used to withdraw the photoresist through the drain lines.

In such a photoresist dispensing process according to the present invention, photoresist flows more rapidly through the first charge pump 60 and the second charge pump 110 than through the dispensing pump 30, to prevent bubbles from being produced in the flow of photoresist. Regardless, any bubbles that are produced are filtered off by the bubble removal filter 70. Therefore, the foreign substance removal filter 40 is very effective at removing foreign substances from the photoresist. Thus, only photoresist of a good quality is dispensed onto the wafer W.

At the same time, the first and second buffer tanks 100 and 80 buffer the photoresist. The tanks 100, 80 thus prevent supply and process defects caused by an oversupply or lack of photoresist.

As described above, according to the present invention, photoresist is withdrawn at a relatively high rate from a bottle 10, thereby substantially preventing or minimizing the amount of bubbles (both large bubbles and micro bubbles) produced in the photoresist. Moreover, even if bubbles are generated, the bubbles are removed from the photoresist by a bubble removal filter 70 before the photoresist arrives at a foreign substance removal filter 40. Thus, the following advantages are provided. First, the foreign substance removal filter 40 receives photoresist that is substantially devoid of bubbles. Accordingly, the foreign substance removal filter 40 is very efficient at removing foreign substances from the photoresist. Accordingly, photoresist of a high quality is dispensed onto a wafer W. In addition, the photoresist does not experience a significant load in the foreign substance removal filter 40. Thus, the dispensing pump 30 delivers the photoresist under a uniform pressure. As a result, the wafer W is covered with a layer of photoresist having a uniform thickness. Therefore, a precise pattern can be formed on the wafer W when the layer of photoresist is patterned and used as a mask during an etching process.

Finally, although the present invention has been described above in connection with the preferred embodiments thereof, the present invention is not so limited. Rather, the disclosed embodiments can be modified and varied as will be apparent to those of ordinary skill in the art. Accordingly, changes to and modifications of the disclosed embodiments are seen to be within the true spirit and scope of the invention as defined by the appended claims.

What is claimed is:

1. Photoresist dispensing apparatus for use in coating a substrate with photoresist, the photoresist dispensing apparatus comprising:
   at least one bottle containing photoresist;
   a spray nozzle;
   a supply line connecting the spray nozzle to the at least one bottle so that photoresist can be supplied from the at least one bottle to the spray nozzle;
   a first filter disposed in the supply line at an end of the supply line proximate the spray nozzle, the first filter being of a type that will remove foreign substances from the photoresist;
   a dispensing pump connected to the supply line upstream of the first filter to deliver photoresist through the first filter and spray nozzle;
   a charge pump connected to the supply line upstream of the dispensing pump to coerce photoresist into the supply line from the at least one bottle;
   a bubble removal filter disposed in the supply line downstream of the charge pump and upstream of the first filter, the bubble removal filter being of a type that will remove air bubbles from the photoresist; and
   a buffer tank disposed in the supply line between the bubble removal filter and the dispensing pump so as to store a volume of the photoresist, from which the bubbles have been removed by the bubble removal filter, for delivery to the spray nozzle by the dispensing pump.

2. The apparatus of claim 1, wherein the charge pump has a higher capacity, in terms of pressure generated, than the dispensing pump.

3. The apparatus of claim 1, wherein the bubble removal filter has a housing, an inlet pipe and an outlet pipe that extend from the housing and to which the supply line is connected, and a membrane disposed in the housing.

4. The apparatus of claim 3, wherein the inlet and outlet pipes extend from opposite sides of the housing, and the housing has an inner diameter larger than each of the inner diameters of the inlet and outlet pipes.

5. The apparatus of claim 3, wherein the first filter includes a membrane, and the membrane of the bubble removal filter is stronger, under a given fluid pressure, than the membrane of the first filter.

6. The apparatus of claim 3, and further comprising an exhaust pipe connected to the housing of the bubble removal filter and by which air formed from an accumulation of the bubbles in the housing is exhausted from the housing.

7. The apparatus of claim 1, and further comprising a plurality of level sensors operatively associated with the buffer tank so as to sense the presence of the photoresist at a plurality of levels in the buffer tank.

8. The apparatus of claim 7, wherein the level sensors comprise a top level sensor operatively associated with a top portion of the buffer tank so as to sense the presence of photoresist at the top portion of the tank, a center level sensor operatively associated with a central portion of the buffer tank so as to sense the presence of photoresist at the central portion of the tank, and a bottom level sensor operatively associated with a bottom portion of the buffer tank so as to sense the presence of photoresist at the bottom portion of the tank.

9. Photoresist dispensing apparatus for use in coating a substrate with photoresist, the photoresist dispensing apparatus comprising:
at least one bottle containing photoresist;
a spray nozzle;
a supply line connecting the spray nozzle to the at least one bottle so that photoresist can be supplied from the at least one bottle to the spray nozzle;
a first filter disposed in the supply line at an end of the supply line proximate the spray nozzle, the first filter being of a type that will remove foreign substances from the photoresist;
a dispensing pump connected to the supply line upstream of the first filter to deliver photoresist through the first filter and spray nozzle;
a first charge pump connected to the supply line upstream of the dispensing pump to coerce photoresist into the supply line from the at least one bottle;
a first buffer tank disposed in the supply line downstream of the first charge pump so as to store a volume of photoresist delivered thereto by the first charge pump;
a bubble removal filter disposed in the supply line downstream of the first buffer tank and upstream of the first filter, the bubble removal filter being of a type that will remove air bubbles from the photoresist;
a second charge pump disposed in the supply line downstream of the first buffer tank and positioned to deliver photoresist from the first buffer tank to the bubble removal filter; and
a second buffer tank disposed in the supply line between the bubble removal filter and the dispensing pump so as to store a volume of the photoresist, from which the bubbles have been removed by the bubble removal filter, for delivery to the spray nozzle by the dispensing pump.

10. The apparatus of claim 9, wherein the first charge pump has a higher capacity, in terms of pressure generated, than the dispensing pump.

11. The apparatus of claim 9, wherein the bubble removal filter has a housing, an inlet pipe and an outlet pipe that extend from the housing and to which the supply line is connected, and a membrane disposed in the housing.

12. The apparatus of claim 11, wherein the inlet and outlet pipes extend from opposite sides of the housing, and the housing has an inner diameter larger than each of the inner diameters of the inlet and outlet pipes.

13. The apparatus of claim 11, wherein the first filter includes a membrane, and the membrane of the bubble removal filter is stronger, under a given fluid pressure, than the membrane of the first filter.

14. The apparatus of claim 10, and further comprising an exhaust pipe connected to the housing of the bubble removal filter and by which air formed from an accumulation of the bubbles in the housing is exhausted from the housing.

15. The apparatus of claim 10, wherein each of the first and second buffer tanks comprises a plurality of level sensors operatively associated with the buffer tank so as to sense the presence of the photoresist at a plurality of levels in the buffer tank.

16. The apparatus of claim 15, wherein the level sensors operatively associated with each of the buffer tanks comprise a top level sensor operatively associated with a top portion of the buffer tank so as to sense the presence of photoresist at the top portion of the tank, a center level sensor operatively associated with a central portion of the buffer tank so as to sense the presence of photoresist at the central portion of the tank, and a bottom level sensor operatively associated with a bottom portion of the buffer tank so as to sense the presence of photoresist at the bottom portion of the tank.

17. An assembly for use in a photoresist dispensing apparatus having at least one bottle for containing photoresist, a spray nozzle, and a supply line for connecting the spray nozzle to the at least one bottle, the assembly comprising:
a first filter of a type that will remove foreign substances from photoresist;
a dispensing pump connected in-line with and upstream of the first filter with respect to a flow direction in which photoresist is to flow through the assembly;
a charge pump connected in-line with and upstream of the dispensing pump with respect to the flow direction;
a bubble removal filter disposed in-line with and downstream of the charge pump and upstream of the first filter with respect to the flow direction, the bubble removal filter being of a type that will remove air bubbles from photoresist, and
a buffer tank disposed in-line with and between the bubble removal filter and the dispensing pump with respect to the flow direction so as to store a volume of photoresist from which the bubbles have been removed by the bubble removal filter.

18. The assembly of claim 17, wherein the charge pump has a higher capacity, in terms of pressure generated, than the dispensing pump.

19. The assembly of claim 17, wherein the bubble removal filter has a housing, an inlet pipe and an outlet pipe that extend from the housing and to which the supply line is connected, and a membrane disposed in the housing.

20. The assembly of claim 19, wherein the inlet and outlet pipes extend from opposite sides of the housing, and the housing has an inner diameter larger than each of the inner diameters of the inlet and outlet pipes.

21. The assembly of claim 18, wherein the first filter includes a membrane, and the membrane of the bubble removal filter is stronger, under a given fluid pressure, than the membrane of the first filter.

22. The assembly of claim 17, and further comprising a plurality of level sensors operatively associated with the buffer tank so as to sense the presence of photoresist at a plurality of levels in the buffer tank.

23. The assembly of claim 22, wherein the level sensors comprise a top level sensor operatively associated with a top portion of the buffer tank so as to sense the presence of photoresist at the top portion of the tank, a center level sensor operatively associated with a central portion of the buffer tank so as to sense the presence of photoresist at the central portion of the tank, and a bottom level sensor operatively associated with a bottom portion of the buffer tank so as to sense the presence of photoresist at the bottom portion of the tank.

* * * * *